(12) United States Patent
McHugh et al.

(10) Patent No.: US 10,373,864 B2
(45) Date of Patent: Aug. 6, 2019

(54) SYSTEMS AND METHODS FOR WETTING SUBSTRATES

(71) Applicant: Applied Materials, Inc., Santa Clara, CA (US)

(72) Inventors: Paul McHugh, Kalispell, MT (US); Bridger Hoerner, Kalispell, MT (US); Marvin Bernt, Kalispell, MT (US); Thomas H. Oberlitner, Kalispell, MT (US); Brian Aegerter, Kalispell, MT (US); Richard W. Plavidal, Kalispell, MT (US); Andrew Anten, Kalispell, MT (US); Adam McClure, Kalispell, MT (US); Randy Harris, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/852,961

(22) Filed: Dec. 22, 2017

(65) Prior Publication Data
US 2018/0182664 A1    Jun. 28, 2018

Related U.S. Application Data

(60) Provisional application No. 62/439,334, filed on Dec. 27, 2016.

(51) Int. Cl.
| | | |
|---|---|---|
| *C25D 5/34* | (2006.01) | |
| *C25D 7/12* | (2006.01) | |
| *H01L 21/288* | (2006.01) | |
| *H01L 21/768* | (2006.01) | |

(52) U.S. Cl.
CPC .... *H01L 21/76826* (2013.01); *H01L 21/2885* (2013.01); *H01L 21/76877* (2013.01); *C25D 5/34* (2013.01); *C25D 7/12* (2013.01)

(58) Field of Classification Search
None
See application file for complete search history.

(56) References Cited

U.S. PATENT DOCUMENTS

| | | | |
|---|---|---|---|
| 2005/0092431 A1 | 5/2005 | Nakamoto et al. | |
| 2010/0320609 A1* | 12/2010 | Mayer | H01L 21/2885 257/773 |
| 2012/0052204 A1 | 3/2012 | Puch et al. | |

(Continued)

FOREIGN PATENT DOCUMENTS

JP    2003-282409 A    10/2003

OTHER PUBLICATIONS

International Search Report and Written Opinion dated Aug. 10, 2018 in PCT application No. PCT/US2017/068399, all pages.

*Primary Examiner* — Thien F Tran
(74) *Attorney, Agent, or Firm* — Kilpatrick Townsend & Stockton LLP (57) ABSTRACT

Methods of wetting a semiconductor substrate may include forming a controlled atmosphere in a processing chamber housing the semiconductor substrate. The semiconductor substrate may define a plurality of features, which may include vias. The methods may include flowing a wetting agent into the processing chamber. A chamber pressure may be maintained below about 100 kPa. The methods may also include wetting the plurality of features defined in the substrate.

19 Claims, 4 Drawing Sheets

(56) References Cited

U.S. PATENT DOCUMENTS

| | | | |
|---|---|---|---|
| 2013/0171833 A1* | 7/2013 | Buckalew | C25D 5/00 |
| | | | 438/758 |
| 2015/0179458 A1 | 6/2015 | Mayer et al. | |
| 2016/0258078 A1 | 9/2016 | Thorum et al. | |
| 2017/0092484 A1* | 3/2017 | Brown | H01L 21/02057 |

* cited by examiner

SYSTEMS AND METHODS FOR WETTING SUBSTRATES

CROSS REFERENCES TO RELATED APPLICATIONS

This application claims priority to U.S. Provisional Application No. 62/439,334, filed Dec. 27, 2016. The entire contents of that application are hereby incorporated by reference in their entirety for all purposes.

TECHNICAL FIELD

The present technology relates to wetting substrates in semiconductor processing. More specifically, the present technology relates to systems and methods that provide wetting within vias and other structures with few wetting defects.

BACKGROUND

Integrated circuits are made possible by processes which produce intricately patterned material layers on substrate surfaces. Producing patterned material on a substrate requires controlled methods for applying and removing material. For removal, chemical or physical etching may be performed for a variety of purposes including transferring a pattern in photoresist into underlying layers, thinning layers, or thinning lateral dimensions of features already present on the surface. Once a material has been etched or otherwise processed, the substrate or material layers are cleaned or prepared for further operations.

Subsequent processing operations may include preparing the substrate for operations including plating. These processes can involve stripping materials, cleaning processed layers or patterns, removing particulates, or wetting substrates in preparation for a plating process. Plating operations often use an electrochemical process for forming or depositing metal materials into trenches, vias, and other structures formed on a substrate. As device features become more intricate and compact, sufficient plating within features can become more difficult.

Thus, there is a need for improved systems and methods that can be used to produce high quality devices and structures. These and other needs are addressed by the present technology.

SUMMARY

Systems and methods of wetting a semiconductor substrate may include forming a controlled atmosphere in a processing chamber housing the semiconductor substrate. The semiconductor substrate may define a plurality of features, which may include vias. The methods may include flowing a wetting agent into the processing chamber. A chamber pressure may be maintained below about 100 kPa. The methods may also include wetting the plurality of features defined in the substrate.

The methods may further include pressurizing the processing chamber to about atmospheric conditions. The methods may also include maintaining the wetting agent in contact with the plurality of features for a period of time subsequent pressurizing the processing chamber. In embodiments the period of time may be less than about one minute. Substrates of the present technology may define at least 1,000 features, and less than 5% of the features may contain a bubble defect in the wetting agent or in subsequent plating.

A carbon dioxide atmosphere may be formed by a continuous purge of carbon dioxide, a pump down and backfill of carbon dioxide, a carbon dioxide replacement operation, or by a load lock transfer process into a carbon dioxide environment. The carbon dioxide atmosphere may include greater than 50% carbon dioxide in some embodiments. The plurality of features may include vias formed in the semiconductor substrate, and at least one via may be characterized by a diameter of at least about 20 μm. In some embodiments the wetting agent may be or include degassed deionized water. The degassed deionized water may be degassed below about 20 ppm. In embodiments the wetting agent may be flowed into the processing chamber by a gravity-induced flow, a forced flow, or a spray. The chamber pressure may be maintained below about 20 kPa during delivery of the wetting agent into the chamber. In embodiments, the wetting agent may absorb over 98% of carbon dioxide residing in the plurality of features defined by the substrate.

The present technology also includes methods of wetting a semiconductor substrate. The methods may include forming a controlled atmosphere in a processing chamber housing the semiconductor substrate. The semiconductor substrate may define a plurality of vias including at least one via characterized by a diameter greater than about 50 μm. The methods may include reducing a pressure within the processing chamber to below about 10 kPa. The methods may include flowing a wetting agent into the processing chamber. The methods may include pressurizing the processing chamber above about 50 kPa. The methods may also include wetting the plurality of vias defined on the semiconductor substrate. In embodiments less than 1% of the vias may contain a defect in the wetting.

The controlled atmosphere in exemplary methods may include one or more fluids selected from the group consisting of carbon dioxide, carbon monoxide, oxygen, nitrogen, argon, ammonia, bromine, diazene, acetylene, krypton, xenon, radon, nitrous oxide, hydrogen selenide, and hydrocarbons. In embodiments the wetting agent may include water. Subsequent the pressurizing, the chamber may be maintained at a pressure above about 50 kPa for a period of time. In embodiments the period of time may be between about 1 second and about 20 seconds.

The present technology also includes methods of wetting a substrate. The methods may include providing a substrate to a processing chamber. The substrate may define a plurality of features. The methods may include displacing air from the plurality of features defined in the substrate. The air may be displaced with carbon dioxide in some embodiments. The methods may include maintaining a pressure within the processing chamber below about 10 kPa. The methods may include flowing deionized water into the processing chamber. In some embodiments the deionized water may be degassed below about 5 ppm. The methods may also include pressurizing the processing chamber above about 10 kPa for a period of time. The methods may include wetting the plurality of features defined on the substrate. In some embodiments greater than 99% of the carbon dioxide may be removed from the features.

In some embodiments pressurizing the processing chamber may raise the pressure above about 90 kPa. Exemplary substrates of the methods may define over one million features. In embodiments less than 0.01% of features of the plurality of features may be characterized by a defect comprising a bubble within the wetting agent or subsequent plating.

Such technology may provide numerous benefits over conventional technology. For example, the present operations may reduce voids and defects in subsequent electroplating operations. Utilizing a carbon dioxide environment also may provide process robustness compared to an air environment. Inadvertent wetting due to splashing, drips, or other issues may lead to bubble defects or increased absorption times in an ambient environment, whereas a carbon dioxide environment may provide more robust processing in a greatly reduced time. Additionally, the improved methodology may reduce queue times by displacing residual non-condensable gas in shorter time frames than conventional technologies. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Various operations in semiconductor manufacturing and processing are performed to produce vast arrays of features across a substrate. As layers of semiconductors are formed, vias, trenches, and other pathways are produced within the structure. These features may then be filled with a conductive or metal material that allows electricity to conduct through the device from layer to layer. As device features continue to shrink in size, so too does the amount of metal providing conductive pathways through the substrate. As the amount of metal is reduced, the quality of the fill may become more critical to ensure adequate electrical conductivity through the device. Accordingly, manufacturing may desire to reduce or remove imperfections and discontinuities in the pathways.

Electroplating operations may be performed to provide conductive material into vias and other features on a substrate. Electroplating utilizes an electrolyte bath containing ions of the conductive material to electrochemically deposit the conductive material onto the substrate and into the features defined on the substrate. Processing may involve a pre-wetting process in which the surfaces and vias of the substrate are wetted prior to electroplating. When a substrate is introduced to a pre-wet operation, it is often dry and exposed to air, although residual liquid such as from a pre-clean operation may also be present. A purpose of such pre-wet operations is to reduce the areas where plating may not occur due to air bubbles being trapped within the features. If these bubbles are not dislodged, then the bubbles may act as blocking sites to the plating. When features do not receive adequate plating, the interconnect functions may not operate effectively, which may lead to device issues or failure.

Conventional technologies have struggled with complete removal of air bubbles within device features because the materials and fluids used in processing operations may have difficulty displacing air within vias and other features. As these features reduce in size, or increase in aspect ratio, displacement may become even more difficult. Over time some of the air or trapped gas may be absorbed into the wetting agent and displaced, but this may not completely remove the gas, and may take extended periods of time, which may reduce substrate throughput and overall queue times.

The present technology overcomes these deficiencies by displacing air with a more soluble material, and by processing the wetting agents to facilitate diffusion of non-condensable gas out of vias and into the bulk fluid. Wetting agents may be or include water or aqueous solutions. Because water includes amounts of oxygen naturally, as well as amounts of air constituents like nitrogen, the water may not readily absorb oxygen and nitrogen air trapped in a feature, or may require extended periods of time for the removal. By adjusting the constituents of the wetting agent and/or by adjusting the constituents of the gas to be displaced, the present technology may provide reduced levels of trapped air within device features. After describing an exemplary chamber in which embodiments of the present technology may be performed, the remaining disclosure will discuss methods and aspects of the systems and processes of the present technology.

Figure 1:
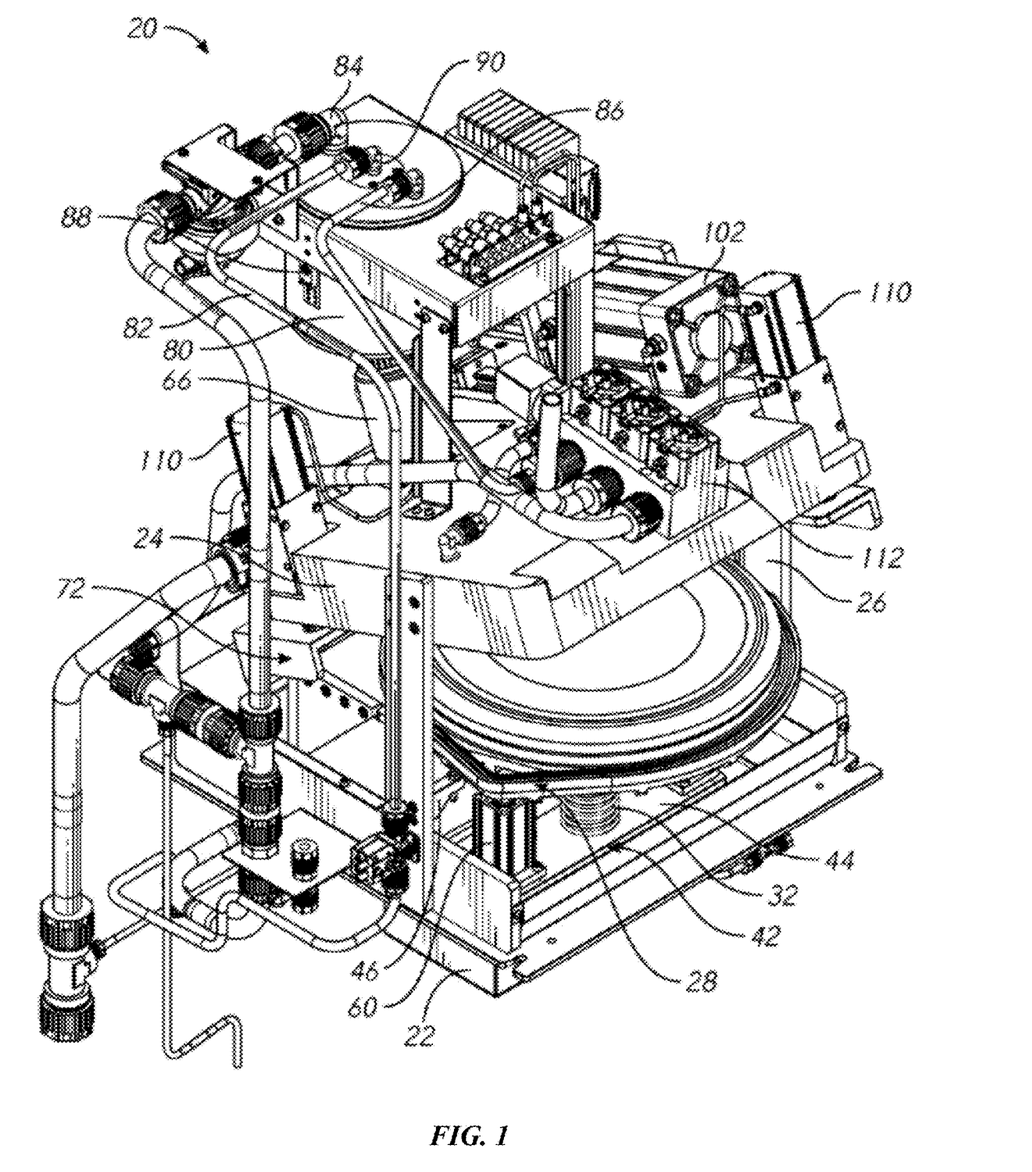
FIG. 1 shows a schematic cross-sectional view of a chamber in which methods may be practiced according to embodiments of the present technology.

FIG. 1 shows a schematic cross-sectional view of a chamber 20 in which methods may be practiced according to embodiments of the present technology. Chamber 20 illustrates an exemplary pre-wet apparatus having a chamber plate 24 supported by side posts 26 on a base 22. The chamber 20 includes a platform assembly 28 that may include a chucking plate for receiving a chuck having a substrate, which may have features to be wetted. A lift frame 72 couples with the platform assembly 28, which may allow the substrate to be tilted within the chuck. Pivot actuator 102 pivots the platform assembly 28 between open and processing positions. Lift actuators 110 may allow the lift frame 72 to move linearly. Spring 32 may be configured to pull a chuck fitting down, which may facilitate the chucking and release of the substrate.

Figure 2:
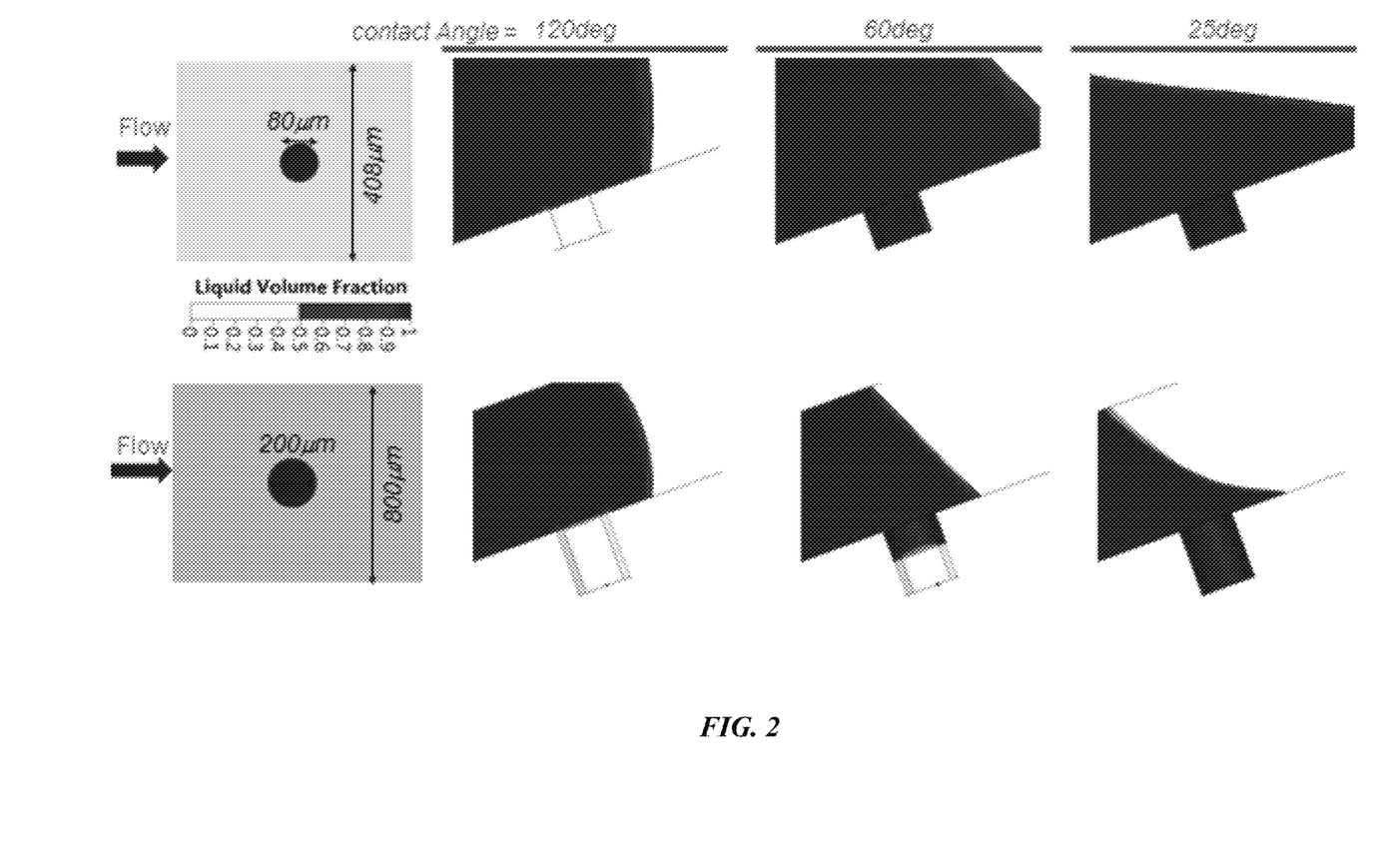
FIG. 2 shows illustrations of wetting operations according to embodiments of the present technology.

Spring frame 42 may be attached to the bottom surface of a chuck plate with side arms 46 on opposite ends of cross plate 44. Linear chuck actuators 60 may be positioned at opposite sides of the cross plate 44. A water degasification tank 80 may be supported on the chamber plate 24. A water supply line 82 may connect to a spray nozzle 90 inside of tank 80. A vacuum port 84 on the tank 80 may connect to a vacuum source. A pressure equalization line 86 may connect to an equalization port within the process chamber. The lower end of the tank 80 may be connected to the chamber liquid inlet through a valve 66. A level sensor 88 may be provided to measure the liquid level within the tank 80. A valve block 112, may control vacuum in the chamber. In operation, water or other wetting fluids may be provided in chamber 20 in a controlled delivery of fluid to avoid splashing on the substrate Although many feature sizes and trenches in semiconductor manufacturing are on the nanometer scale, many vias formed through devices may be on a larger scale, such as on the micron scale. Despite the relatively larger size of features of these dimensions, wetting of the features, such as vias, can prove difficult due to various characteristics and parameters of the process and materials used. FIG. 2 shows illustrations of wetting operations according to embodiments of the present technology, as well as issues that occur during wetting operations. The figure illustrates two vias formed on a substrate as well as the wetting of those vias under different conditions.

During the wetting process, a substrate may be tilted to an angle between about 5° and about 60°, such as about 20°, for example. This may facilitate wetting of some feature types, although many features may not properly wet. The dynamic contact angle of the wetting agent may affect the degree of wetting within a feature, and the wetting agent ability to penetrate the vias and other features. A contact angle of 25° was able to fully wet both the larger and smaller vias illustrated, although producing such a contact angle may be difficult or impractical. For example, photoresist may be formed or deposited on the substrate, which may affect the contact angle of the wetting agent. Additionally, aspect ratio may affect the fill behavior, and may affect the contact angle to fully wet a via. For example, vias characterized by an aspect ratio less than about 1 or less than about 0.5 may be fully wetted at contact angles greater than or about 25°, greater than or about 40°, or greater than or about 50°. As aspect ratio increases, the contact angle to provide wetting within a via may reduce to below or about 30°, below or about 25°, below or about 20°, below or about 15°, or less.

Additionally, although an initial contact angle may be lower, the dynamic contact angle may be affected by the formation and array of vias themselves. For example, substrates may have hundreds, thousands, or millions or more features that are to be wetted. Moreover, these features may be of several different sizes ranging over hundreds of micrometers and formed across the substrate in varying patterns having both densely spaced features as well as more pronounced spacing in other areas. Accordingly, a particular dynamic contact angle may not be maintained across the entire surface during the wetting process with any particular wetting agent. For example, although the figure shows that at a 25° contact angle the features were fully wetted, even at a dynamic contact angle of 60°, the larger via illustrated only partially wet, and at a dynamic contact angle of 120°, both features were fully capped by the wetting agent, which trapped gas within the features, and was unable to deliver wetting agent into the features defined on the substrate.

A certain amount of non-condensable gas will be trapped in some of the vias across a substrate surface, while other features fully wet. This gas may be absorbed into the wetting agent over time, although full absorption may not occur, and any absorption that does occur may not occur on an adequate time scale. The amount and time of absorption may be dependent on a number of factors related to the wetting agent as well as the trapped gas. For example, as noted previously, the gas being displaced in some wetting operations may be air at atmospheric conditions. Additionally, the wetting agent may include water or an aqueous solution. The ability of water to absorb oxygen and nitrogen, which constitute about 99% of air, is less than the ability of water to absorb many other materials. Reducing the pressure within a system may increase the absorption rate of oxygen and nitrogen indirectly by reducing the amount of gas to be absorbed, although the time to fully absorb the gases may be many minutes or more. This will reduce substrate throughput if that amount of time is required for each substrate, such as a semiconductor wafer, and the process may not fully remove the air from each of the features. However, by adjusting the wetting agent and the atmosphere of the process according to the present technology, these process times may be reduced.

Figure 3:
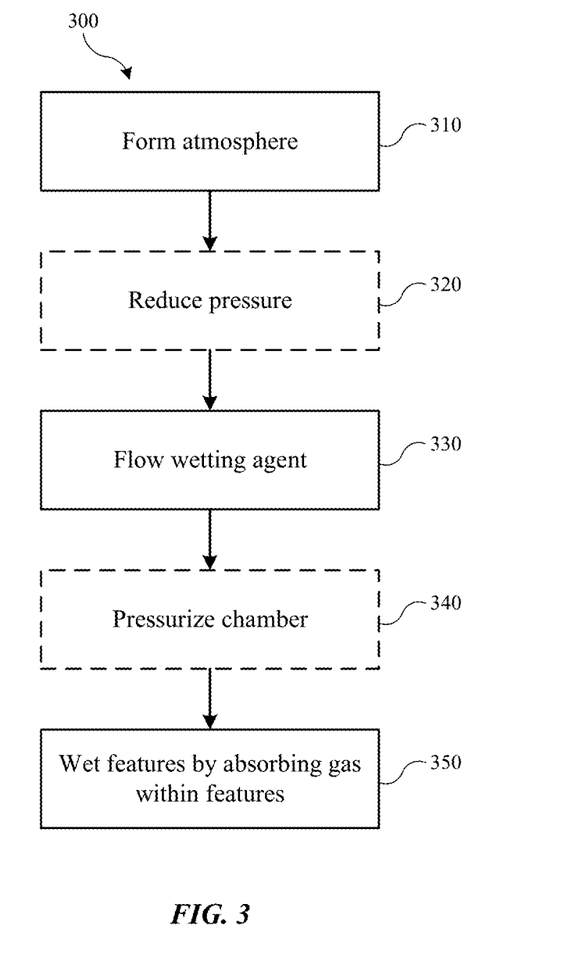
FIG. 3 shows a method of wetting a semiconductor substrate according to embodiments of the present technology.

Turning to FIG. 3 is shown a method 300 of wetting a semiconductor substrate according to embodiments of the present technology. Method 300 may provide improved wetting of features and vias, which may in turn reduce defects in electroplating operations. The method may include forming a controlled atmosphere in a processing chamber housing the semiconductor substrate at operation 310. The semiconductor substrate may include a number of features formed on the surface of the substrate. The method may optionally include reducing a pressure within the processing chamber to below atmospheric conditions at operation 320.

The method may also include flowing a wetting agent into the processing chamber at operation 330. The wetting agent may contact the substrate and features during a wetting operation. The method may further include optional operation 340, which may include pressurizing the chamber above a threshold up to about atmospheric pressure. The method may also include wetting the features at operation 350. The wetting process of method 300 may provide improved wetting capability over a variety of feature types as will be discussed in detail below.

Method 300 according to the present technology may involve maintaining a below-atmospheric pressure within the system during one or more operations. For example, with atmospheric pressure being approximately 101 kPa, the chamber pressure may be maintained below about 100 kPa during one or more operations of the present technology. In some embodiments the pressure may be further reduced to below or about 90 kPa, below or about 80 kPa, below or about 70 kPa, below or about 60 kPa, below or about 50 kPa, below or about 40 kPa, below or about 30 kPa, below or about 20 kPa, below or about 15 kPa, below or about 10 kPa, below or about 9 kPa, below or about 8 kPa, below or about 7 kPa, below or about 6 kPa, below or about 5 kPa, below or about 4 kPa, below or about 3 kPa, below or about 2 kPa, below or about 1 kPa, or lower. The pressure may also be maintained between any of these stated numbers, or within ranges encompassed by any of these ranges for any of the operations of the present technology.

The reduction in pressure may be at least partially limited to the saturation pressure of the wetting agent, which may be between about 1 kPa and about 4 kPa, for water or aqueous solutions. By reducing the pressure towards the saturation pressure of the wetting agent, the amount of trapped and free gas within the features may be reduced. As the pressure within the system is reduced, the number of moles of gas will be proportionately reduced, which may reduce the amount of gas to be absorbed by the wetting agent. Accordingly, in some embodiments the chamber pressure may be maintained below about 20 kPa, below about 10 kPa, between about 1 kPa and about 20 kPa, or between about 4 kPa and about 10 kPa to reduce the amount of gas to be displaced.

As discussed above with method 300, the present technology may form a controlled atmosphere for the wetting operations. For example, air may be displaced from a process chamber housing the substrate. The displacement may occur in a number of ways and with a number of fluids. The displacement may occur in a number of ways that may reduce the amount of air within the processing chamber. For example, with the substrate housed within the chamber, the chamber may be pumped down to remove an amount of air. Carbon dioxide or some other fluid may then be backfilled into the chamber to create an environment or atmosphere including a lower concentration of air. This cycle may be repeated a number of times by pumping down the chamber and backfilling with carbon dioxide or some other fluid to further reduce the air concentration within the chamber. For example, the cycle may occur once, twice or 3, 4, 5, or more times. Additional cycles may further limit the amount of air within the processing chamber.

Other available displacement techniques may include defining a single outlet from the chamber and providing a continuous stream or purge of fluid, such as carbon dioxide, through the chamber. Additionally, a continuous purge may be effected in which the chamber is often maintained at a positive pressure of flowing fluid, such as carbon dioxide or argon. Accordingly, when the chamber is accessed to provide a substrate for processing, the positive flow of fluid may ensure that air or other environmental constituents are not delivered into the chamber. Also, in a processing system including one or more chambers under a controlled atmosphere, a load lock chamber may provide access to the environment that may include the processing chamber configured to perform the disclosed operations. After the load lock chamber has received a substrate or work piece, the load lock may be purged with the fluid prior to providing access to the other chambers or controlled atmosphere. It is to be understood that these and other ways of maintaining a controlled atmosphere are all encompassed by the present technology.

The controlled atmosphere may be characterized by an amount of one or more fluids, and also may be characterized by an amount of air. For example, the controlled atmosphere may be characterized by constituents in which oxygen and nitrogen together form less than 99% of the controlled atmosphere. In some embodiments, oxygen and/or nitrogen may form less than or about 90% of the controlled atmosphere, and may be included as less than or about 80%, less than or about 70%, less than or about 60%, less than or about 50%, less than or about 40%, less than or about 30%, less than or about 20%, less than or about 10%, less than or about 5%, less than or about 1% of the controlled atmosphere, or less in embodiments. Additionally, one or more other fluids, including carbon dioxide or other materials discussed elsewhere may comprise more than or about 1% of the controlled atmosphere, and the carbon dioxide and/or other fluids may make up greater than or about 5% of the controlled atmosphere, greater than or about 10%, greater than or about 20%, greater than or about 30%, greater than or about 40%, greater than or about 50%, greater than or about 60%, greater than or about 70%, greater than or about 80%, greater than or about 90%, greater than or about 99% of the controlled atmosphere, or the fluids may substantially, essentially, or completely make up the controlled atmosphere in embodiments.

The fluids may include any fluid or gas for displacing the air, and are not limited to carbon dioxide, which is discussed throughout as an exemplary fluid for the controlled atmosphere. A non-exhaustive list of gases that may be used includes, for example, carbon dioxide, carbon monoxide, oxygen, nitrogen, argon, ammonia, bromine, diazene, acetylene, krypton, xenon, radon, nitrous oxide, hydrogen selenide, and other gases. Additionally hydrocarbons may be used including methane, ethane, propane, butane, etc. The selection of a gas or gases may be based on their solubility in water or an aqueous solution, and a gas may be selected based on the associated Henry's Law coefficient in water. For example, oxygen may be characterized by a coefficient of approximately 0.0013 $mol_g/L_{sol} \cdot atm$, and nitrogen may be characterized by a coefficient of approximately 0.0006 $mol_g/L_{sol} \cdot atm$. Carbon dioxide by comparison may be characterized by a coefficient of approximately 0.03 $mol_g/L_{sol} \cdot atm$, which is at least an order of magnitude higher than oxygen and nitrogen. Accordingly, carbon dioxide may be many times more readily absorbed in water and other aqueous solutions than oxygen or nitrogen. Other fluids that may be selected may be characterized by a Henry's Law coefficient of greater than or about 0.0001 $mol_g/L_{sol} \cdot atm$ at comparable operating conditions in embodiments.

Figure 4:
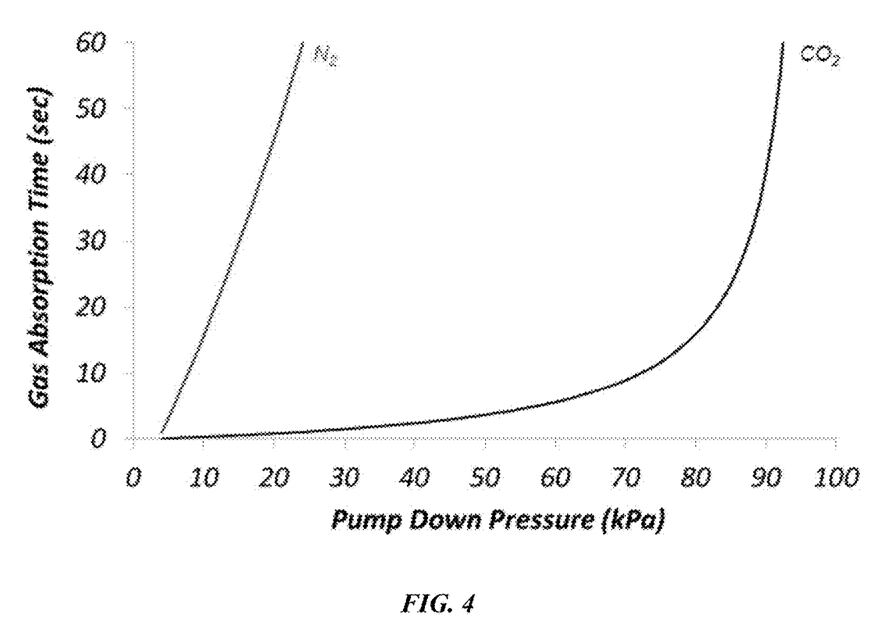
FIG. 4 shows a chart illustrating the gas absorption time at various pressures for nitrogen and carbon dioxide according to embodiments of the present technology.

By utilizing an atmosphere including fluids that may be more readily absorbed in water than air may be absorbed, the time to displace residual gas may be reduced. FIG. 4 shows a chart illustrating the gas absorption time at various pressures for nitrogen and carbon dioxide according to embodiments of the present technology. Even at below atmospheric conditions of 50 kPa, the time required to absorb residual nitrogen gas is over ten minutes, while carbon dioxide can be absorbed in under five seconds. Accordingly, the methods may involve maintaining the wetting agent in contact with the plurality of features defined in the substrate for a period of time to allow absorption of residual gas. The period of time may be less than 5 minutes depending on the fluid in the atmosphere, as well as the chamber conditions. However, by utilizing alternative environmental materials instead of air, the period of time for absorption may be further reduced. In some embodiments, the period of time may be less than or about 3 minutes, less than or about 1 minute, less than or about 50 seconds, less than or about 45 seconds, less than or about 40 seconds, less than or about 35 seconds, less than or about 30 seconds, less than or about 25 seconds, less than or about 20 seconds, less than or about 15 seconds, less than or about 10 seconds, less than or about 9 seconds, less than or about 8 seconds, less than or about 7 seconds, less than or about 6 seconds, less than or about 5 seconds, less than or about 4 seconds, less than or about 3 seconds, less than or about 2 seconds, less than or about 1 second, or less. The period of time may also be any range defined between any of these stated numbers or any smaller range encompassed within any of these ranges.

As discussed previously, the methods may also include pressurizing the processing chamber subsequent contacting the wetting agent with the features of the substrate. The pressurizing may increase the chamber pressure to above or about 10 kPa, and in embodiments may increase the chamber pressure to above or about 20 kPa, above or about 30 kPa, above or about 40 kPa, above or about 50 kPa, above or about 60 kPa, above or about 70 kPa, above or about 80 kPa, above or about 90 kPa, above or about 100 kPa, or up to or above atmospheric conditions. Pressurizing the processing chamber may provide benefits with the absorption of gas remaining in the features. By reducing the pressure previously in the methods, the amount of gas that may be trapped is defined in the system. By increasing the pressure within the chamber subsequent delivering the wetting agent, the volume of space occupied by the gas may be reduced or compressed, and the capacity of the wetting agent to absorb the residual gas may be increased.

When the chamber is vented to atmosphere or the pressure within the system is otherwise increased, the pressure of any residual trapped gas may also increase. Because the gas may be at a higher pressure, the concentration of gas at the liquid interface with the wetting agent may also increase. This may also then allow improved diffusion of residual gas within the wetting agent.

The wetting agent may include any number of fluids or combinations of fluids, such as aqueous solutions and/or water. In some embodiments the wetting agent may be or include deionized water, including degassed deionized water. The deionized water or other wetting agents may be delivered to the processing chamber in different ways to contact the substrate. For example, the wetting agent may be delivered by a gravity-induced flow from a reservoir, or the wetting agent may be pumped into the processing chamber. The wetting agent may be maintained static on the substrate or may be continuously flowed over or sprayed across the substrate. In other embodiments a sprayer might be used to deliver the wetting agent within the processing chamber and into contact with the substrate. Any number of spray or nozzle configurations may be used to produce specific distribution patterns, flow velocities, or coverage profiles on the wafer. The wetting agent may also be modified in one or more ways to improve absorption of gas from air or any other fluid within the chamber environment and that may be trapped within features of the substrate. In some embodiments, the wetting agent may be degassed, such as degassed deionized water. The deionized water may be flowed through a contactor, such as a membrane contactor, prior to being delivered to the processing chamber to remove oxygen or other gas species, such as carbon dioxide. The wetting agent may be degassed to less than or about 50 ppm in embodiments, and may be degassed to less than or about 40 ppm, less than or about 30 ppm, less than or about 20 ppm, less than or about 15 ppm, less than or about 10 ppm, less than or about 9 ppm, less than or about 8 ppm, less than or about 7 ppm, less than or about 6 ppm, less than or about 5 ppm, less than or about 4 ppm, less than or about 3 ppm, less than or about 2 ppm, less than or about 1 ppm, or less. By degassing the wetting agent to reduced levels of ambient gases as well as environmental gases of the chamber, such as carbon dioxide, improved absorption characteristics may be afforded by the present technology.

The methods may remove greater than or about 50% of any residual gas within vias or other features defined in the substrate. In some embodiments, the methods may remove residual air, carbon dioxide, or other gas, and may remove greater than or about 60% of residual gas, greater than or about 70% of residual gas, greater than or about 80% of residual gas, greater than or about 90% of residual gas, greater than or about 91% of residual gas, greater than or about 92% of residual gas, greater than or about 93% of residual gas, greater than or about 94% of residual gas, greater than or about 95% of residual gas, greater than or about 96% of residual gas, greater than or about 97% of residual gas, greater than or about 98% of residual gas, greater than or about 99% of residual gas, greater than or about 99.9% of residual gas, greater than or about 99.99% of residual gas, greater than or about 99.999% of residual gas, or may substantially, essentially, or completely remove any residual gas from the features defined on the substrate. The residual gas may be removed via displacement including absorption by the wetting agent in embodiments.

As previously noted, exemplary substrates may have any number of features defined within the substrate. The features may include vias of various sizes including diameters greater than or about 1 µm, greater than or about 5 µm, greater than or about 10 µm, greater than or about 20 µm, greater than or about 50 µm, greater than or about 100 µm, greater than or about 200 µm, greater than or about 400 µm, or more depending on the via. By diameter is generally meant a distance across any portion of the via or feature. For example, not all vias or features may be round, and may be characterized by any other shape or geometry, including oval-shaped vias, where any dimension of the geometry may constitute a diameter noted. Additionally, the vias or features may be characterized by a depth of any of the dimensions and ranges noted. Generally, any the vias or features may be in any geometry or orientation including vertical or face-down orientations. Accordingly, vias may be characterized by an aspect ratio, or a ratio of the depth to width of the via of greater than or about 0.5, greater than or about 1, greater than or about 1.5, greater than or about 2, or more. Across the substrate may be any pattern of features and/or vias, which may vary in dimension or spacing. The number of vias on a substrate may vary for different devices, but exemplary substrates may have a number of vias and/or features, such as greater than or about 10 vias or features, greater than or about 100, greater than or about 500, greater than or about 1000, greater than or about 10,000, greater than or about 100,000, greater than or about 500,000, greater than or about 1,000,000, greater than or about 5,000,000, or more vias or features defined across the substrate of varying shapes and distribution.

The present technology may reduce the number of vias or features in which gas may remain after the wetting operation, which may be in the form of a bubble defect either in the wetting agent or in subsequent operations. For example, subsequent plating operations may form a void or bubble defect at a location in which residual gas was not displaced or absorbed by the wetting agent. The present technology may reduce the number of vias or features including a defect, such as a bubble defect, to less than or about 5% of the vias on the substrate. In some embodiments, the present technology may reduce the number of defects remaining from the wetting operation to less than or about 1% of the vias on the substrate, and may reduce the number of defects to less than or about 0.1%, less than or about 0.01%, less than or about 0.001%, less than or about 0.0001%, less than or about 0.00001%, less than or about 0.000001% of the vias or features on the substrate, or less in embodiments. In some embodiments the present technology may remove all defects from wetting such that no via or feature includes a bubble or other defect in the wetting or subsequent plating.

Figure 5A:
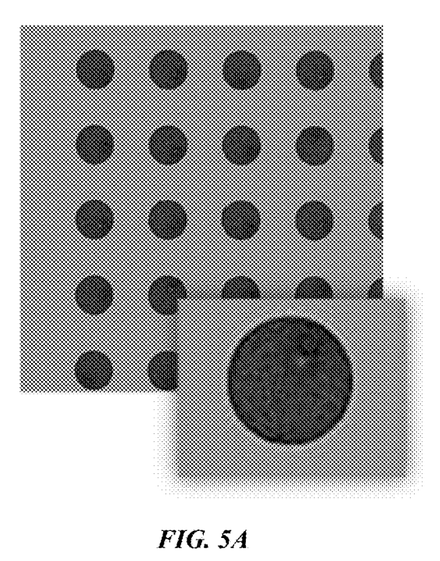
FIGS. 5A-5B show exemplary imaging from conventional processes as well as from processes according to embodiments of the present technology.
Figure 5B:
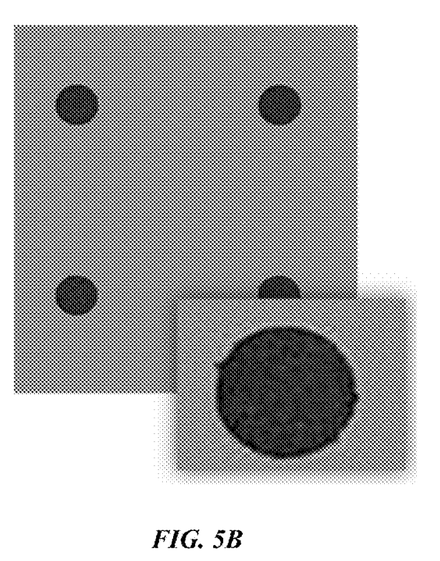

Turning to FIGS. 5A-5B is shown exemplary imaging from conventional processes as well as from processes according to embodiments of the present technology. FIG. 5A shows imaging of a number of vias in which a conventional process was performed including using deionized water as a wetting agent in an air atmosphere. A subsequent plating operation was performed to a controlled depth that would expose any residual gas. With several hundred thousand vias, the process showed over 160,000 bubble defects in the plated metal. FIG. 5B shows imaging from a similar test sample in which operations of the present technology were performed. The process involved utilizing degassed deionized water as the wetting agent in a carbon dioxide atmosphere. The subsequent plating operation identified 4 bubble defects. Subsequent testing produced 2 bubble defects. Incorporating a hold time at atmospheric pressure as discussed above resulted in 1 bubble defect and zero bubble defects in subsequent testing. Accordingly, by utilizing an atmospheric component that may be more readily absorbed by a wetting agent, and by manipulating the wetting agent as discussed elsewhere herein, the present technology was able to reduce the number of bubble defects by several orders of magnitude, and in embodiments was able to prevent bubble defects from forming.

In the preceding description, for the purposes of explanation, numerous details have been set forth in order to provide an understanding of various embodiments of the present technology. It will be apparent to one skilled in the art, however, that certain embodiments may be practiced without some of these details, or with additional details. For example, other substrates that may benefit from the wetting techniques described may also be used with the present technology.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the agent" includes reference to one or more agents and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of wetting a semiconductor substrate, the method comprising:
   forming a carbon dioxide atmosphere in a processing chamber housing the semiconductor substrate, wherein the semiconductor substrate defines a plurality of features;
   flowing a wetting agent into the processing chamber while maintaining the carbon dioxide atmosphere, wherein a chamber pressure is maintained below about 100 kPa during the flowing; and
   wetting the plurality of features defined in the substrate.

2. The method of wetting a semiconductor substrate of claim 1, further comprising:
   pressurizing the processing chamber to about atmospheric conditions; and
   maintaining the wetting agent in contact with the plurality of features for a period of time subsequent pressurizing the processing chamber.

3. The method of wetting a semiconductor substrate of claim 2, wherein the period of time is less than about one minute.

4. The method of wetting a semiconductor substrate of claim 1, wherein the substrate defines at least 1,000 features, and wherein less than 5% of the features contain a bubble defect in the wetting agent.

5. The method of wetting a semiconductor substrate of claim 1, wherein the carbon dioxide atmosphere is formed by a continuous purge of carbon dioxide, a pump down and backfill of carbon dioxide, a carbon dioxide replacement operation, or by a load lock transfer process into a carbon dioxide environment.

6. The method of wetting a semiconductor substrate of claim 1, wherein the carbon dioxide atmosphere comprises greater than 50% carbon dioxide.

7. The method of wetting a semiconductor substrate of claim 1, wherein the plurality of features comprise vias formed in the semiconductor substrate, and wherein at least one via is characterized by a diameter of at least about 20 μm.

8. The method of wetting a semiconductor substrate of claim 1, wherein the wetting agent comprises degassed deionized water.

9. The method of wetting a semiconductor substrate of claim 8, wherein the degassed deionized water is degassed below about 20 ppm.

10. The method of wetting a semiconductor substrate of claim 1, wherein the wetting agent is flowed into the processing chamber by a gravity-induced flow, a forced flow, or a spray.

11. The method of wetting a semiconductor substrate of claim 1, wherein the chamber pressure is maintained below about 20 kPa during delivery of the wetting agent into the chamber.

12. The method of wetting a semiconductor substrate of claim 1, wherein the wetting agent absorbs over 98% of carbon dioxide residing in the plurality of features defined by the substrate.

13. A method of wetting a semiconductor substrate, the method comprising:
   forming a controlled atmosphere in a processing chamber housing the semiconductor substrate, wherein the semiconductor substrate defines a plurality of vias including at least one via characterized by a diameter greater than about 50 μm, and wherein the controlled atmosphere comprises one or more fluids selected from the group consisting of carbon dioxide, carbon monoxide, oxygen, nitrogen, argon, ammonia, bromine, diazene, acetylene, krypton, xenon, radon, nitrous oxide, hydrogen selenide, and hydrocarbons;
   reducing a pressure within the processing chamber to below about 10 kPa;
   flowing a wetting agent into the processing chamber while maintaining the controlled atmosphere;
   pressurizing the processing chamber above about 50 kPa; and
   wetting the plurality of vias defined on the semiconductor substrate, wherein less than 1% of the vias contain a defect in the wetting.

14. The method of wetting a semiconductor substrate of claim 13, wherein the wetting agent comprises water.

15. The method of wetting a semiconductor substrate of claim 13, wherein, subsequent the pressurizing, the chamber is maintained at a pressure above about 50 kPa for a period of time.

16. The method of wetting a semiconductor substrate of claim 15, wherein the period of time is between about 1 second and about 20 seconds.

17. A method of wetting a substrate, the method comprising:
   providing a substrate to a processing chamber, wherein the substrate defines a plurality of features;
   displacing air from the plurality of features defined in the substrate, wherein the air is displaced with carbon dioxide;
   spraying deionized water into the processing chamber, wherein the deionized water is degassed below about 5 ppm, and wherein the spraying occurs while maintaining a pressure within the processing chamber below about 100 kPa with the carbon dioxide;
   pressurizing the processing chamber above about 50 kPa for a period of time; and
   wetting the plurality of features defined on the substrate, wherein greater than 99% of the carbon dioxide is removed from the features.

18. The method of wetting a substrate of claim 17, wherein pressurizing the processing chamber raises the pressure above about 90 kPa.

19. The method of wetting a substrate of claim 17, wherein the substrate defines over one million features, and wherein less than 0.01% of features of the plurality of features are characterized by a defect comprising a bubble within the deionized water.

* * * * *